(12) United States Patent
Montarnal et al.

(10) Patent No.: US 9,315,637 B2
(45) Date of Patent: Apr. 19, 2016

(54) JUNCTION-FUNCTIONALIZED BLOCK COPOLYMERS

(71) Applicant: The Regents of the University of California, Oakland, CA (US)

(72) Inventors: Damien Montarnal, Santa Barbara, CA (US); Yingdong Luo, Goleta, CA (US); Craig J. Hawker, Santa Barbara, CA (US); Edward J. Kramer, Santa Barbara, CA (US); Glenn H. Frederickson, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/573,491

(22) Filed: Dec. 17, 2014

(65) Prior Publication Data

US 2015/0197607 A1 Jul. 16, 2015

Related U.S. Application Data

(60) Provisional application No. 61/919,440, filed on Dec. 20, 2013.

(51) Int. Cl.
| | |
|---|---|
| C08F 293/00 | (2006.01) |
| C08G 81/00 | (2006.01) |
| C08G 81/02 | (2006.01) |
| C09D 153/00 | (2006.01) |
| B05D 3/10 | (2006.01) |
| B44C 1/22 | (2006.01) |

(Continued)

(52) U.S. Cl.
CPC .............. *C08G 81/024* (2013.01); *B05D 3/107* (2013.01); *B44C 1/227* (2013.01); *C09D 153/00* (2013.01); *G03F 1/00* (2013.01); *G03F 7/0002* (2013.01); *Y10T 428/31663* (2015.04)

(58) Field of Classification Search
CPC .... C08G 81/00; C08G 81/024; C09D 153/00; B05D 3/107; B44C 1/227
USPC .......... 430/322; 216/49; 525/330.5, 280, 299, 525/94
See application file for complete search history.

(56) References Cited

U.S. PATENT DOCUMENTS

| | | | | |
|---|---|---|---|---|
| 6,583,223 | B2 * | 6/2003 | Goetz et al. ..................... | 525/88 |
| 7,049,047 | B2 * | 5/2006 | Tenaglia et al. ............ | 430/273.1 |

(Continued)

OTHER PUBLICATIONS

Johnson et al, "Construction of Linear Polymers, Dendrimers, Networks, and Other Polymeric Architectures by Copper-Catalyzed Azide-Alkyne Cycloaddition "Click" Chemistry", Macromolecular Rapid Communications, 29, pp. 1052-1072 (2008).*
Dimitrov-Raytchev et al., Main-chain 1, 2, 3-triazolium-based poly (ionic liquid) s issued from AB+ AB click chemistry polyaddition, *Journal of Polymer Science Part A: Polymer Chemistry* (2012).
Ermakova et al., 1-Vinyl-4-alkyl-1, 2, 4-triazolium salts. *Chemistry of Heterocyclic Compounds* 20, 1167-1169 (1984).

(Continued)

*Primary Examiner* — Amanda C Walke
(74) *Attorney, Agent, or Firm* — Venable LLP; Henry J. Daley

(57) ABSTRACT

Junction-functionalized block copolymers can be used in forming nanostructures. A junction-functionalized block copolymer can include a first polymer block joined to a second polymer block by a junction, where the junction includes one or more electrostatically charged moieties. The block copolymer can include a moiety of formula (I):

A-J-B (I)

where A is a first polymer block, B is a second polymer block, where the A block and the B block are chemically dissimilar, and J is a junction linking the A block to the B block, and including one or more electrostatically charged moieties.

18 Claims, 6 Drawing Sheets

(51) Int. Cl.
*G03F 1/00* (2012.01)
*G03F 7/00* (2006.01)

(56) References Cited

U.S. PATENT DOCUMENTS

| | | | |
|---|---|---|---|
| 8,552,114 B2* | 10/2013 | Handlin et al. | 525/98 |
| 9,006,345 B2* | 4/2015 | Lancaster et al. | 525/275 |
| 9,045,579 B2* | 6/2015 | Xia et al. | 1/1 |
| 2003/0088032 A1* | 5/2003 | Luebben et al. | 525/410 |
| 2007/0160561 A1* | 7/2007 | Ouali et al. | 424/70.16 |
| 2008/0033115 A1* | 2/2008 | Koroskenyi et al. | 525/340 |
| 2008/0182402 A1 | 7/2008 | Li et al. | |
| 2009/0202952 A1 | 8/2009 | Abraham et al. | |
| 2009/0273051 A1 | 11/2009 | Parekh et al. | |
| 2012/0259021 A1* | 10/2012 | Jiang et al. | 514/772.1 |
| 2012/0273762 A1 | 11/2012 | Scherer et al. | |
| 2013/0017335 A1* | 1/2013 | Millward et al. | 427/387 |
| 2013/0030120 A1* | 1/2013 | Lin et al. | 525/54.26 |
| 2014/0088207 A1* | 3/2014 | Elabd et al. | 521/27 |
| 2014/0299578 A1* | 10/2014 | Yamashita et al. | 218/49 |

OTHER PUBLICATIONS

Fournier et al., U.S. Clicking polymers: A straightforward approach to novel macromolecular architectures. *Chem. Soc. Rev.* 36, 1369-1380 (2007).

Henry et al., End-functionalized polymers and junction-functionalized diblock copolymers via RAFT chain extension with maleimido monomers. *Bioconjugate chemistry* 20, 1122-1128 (2009).

Khan et al., Arkivoc, 2009, (xii), 193.

Kim et al., A Supramolecularly Assisted Transformation of Block-Copolymer Micelles into Nanotubes. *Angewandte Chemie International Edition* 48, 4508-4512 (2009).

Nulwala et al., Probing the structure-property relationship of regioisomeric ionic liquids with click chemistry. *Green Chem.* 13, 3345-3349 (2011).

Zhang et al., Synthesis, Characterization and Self-Assembly of Novel Amphiphilic Block Copolymers with a Polyhedral Oligomeric Silsesquioxanes Moiety Attached at the Junction of the Two Blocks. *Macromolecular rapid communications* 30, 1015-1020 (2009).

* cited by examiner

JUNCTION-FUNCTIONALIZED BLOCK COPOLYMERS

CLAIM OF PRIORITY

This application claims priority to provisional U.S. Application No. 61/919,440, filed Dec. 20, 2013, which is incorporated by reference in its entirety.

TECHNICAL FIELD

This invention relates to junction-functionalized block copolymers, and methods of making and using the same.

BACKGROUND

Ordered and nanostructured polymer compositions can be used in a variety of contexts to produce materials having desirable properties, such as the ability to form small, three-dimensional structures. The material properties of such polymer compositions can be tailored to provide useful materials in fields such as nanolithography, photovoltaics, photonic crystals, and nanoporous membranes.

SUMMARY

In one aspect, a block copolymer includes a moiety of formula (I):

$$A\text{-}J\text{-}B \qquad (I)$$

where A is a first polymer block; B is a second polymer block, where the A block and the B block are chemically dissimilar; and J is a junction linking the A block to the B block and including one or more electrostatically charged moieties. In another aspect, a composite structure for forming a patterned substrate includes a substrate and a layer including a block copolymer material formed on at least a portion of a surface of said substrate, where the block copolymer material includes a moiety of formula (I):

$$A\text{-}J\text{-}B \qquad (I)$$

where A, J, and B are defined as above, and where the substrate becomes said patterned substrate after processing the composite structure.

In another aspect, a method for forming a patterned substrate includes the steps of: (a) providing a substrate; (b) forming a layer including a block copolymer material on at least a portion of a surface of said substrate, where the block copolymer material includes a moiety of formula (I):

$$A\text{-}J\text{-}B \qquad (I)$$

where A, J, and B are defined as above; (c) exposing the layer to an etching process, where the etching process exposes a pattern of regions of the substrate; and (d) exposing the pattern of regions of substrate material to a second etching process selected for its ability to etch the layer of substrate exposed by step (c).

Other features, objects and embodiments will be apparent from the description, claims and drawings.

DETAILED DESCRIPTION

Figure 1A:
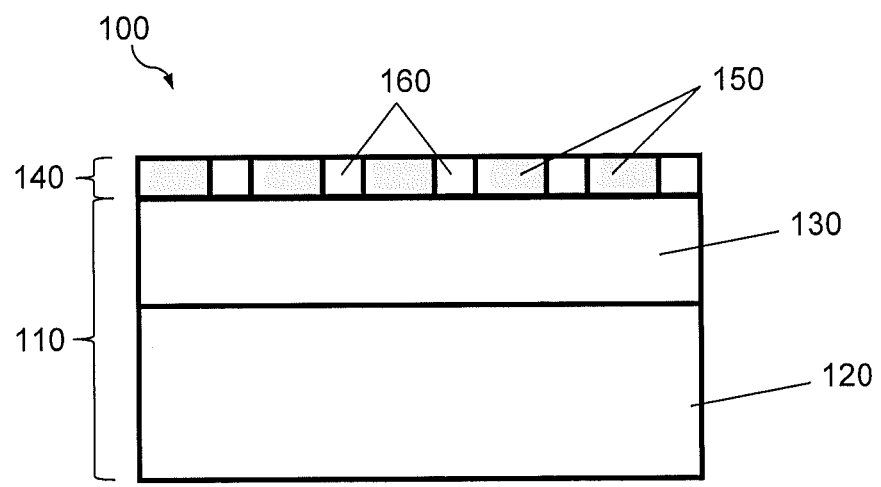
FIG. 1A shows a schematic depiction of a composite structure for forming a patterned substrate.

Embodiments of the invention are discussed in detail below. In describing embodiments, specific terminology is employed for the sake of clarity. However, the invention is not intended to be limited to the specific terminology so selected. While specific exemplary embodiments are discussed, it should be understood that this is done for illustration purposes only. A person skilled in the relevant art will recognize that other components and configurations can be used without departing from the spirit and scope of the invention. All references cited herein are incorporated by reference as if each had been individually incorporated.

Block copolymers that can provide reduced interfacial width and improved long range ordering are described. Long range ordering is useful in applications where excellent control over the structure of block copolymers at the 5 to 300 nm scale is desired, such as, for example, nanolithography, photovoltaics, photonic crystals, and nanoporous membranes. Reduced interfacial width is particularly attractive for block copolymer nanolithography as it allows the creation of three-dimensional structures with sharp edges.

One approach to producing ordered materials involves a segregated block copolymer template. Block copolymers, e.g., with an A-B or A-B-A structure can undergo a self-segregation where the polymers preferentially arrange such that A blocks interact with other A blocks and B blocks interact with other B blocks. Such an arrangement is favored when the A and B blocks are chemically dissimilar, e.g., where one is hydrophilic and the other is hydrophobic.

Some embodiments include methods for making and using block copolymers. As used herein, the term "block copolymer" refers to a polymer including two or more polymer blocks. As used herein, the term "polymer block" refers to a grouping of multiple monomer units, which can be the same (e.g., a homopolymer block) or different (e.g., a copolymer block, a random copolymer block, etc.), and which are part of a continuous polymer chain, which forms part of a larger polymer. A wide variety of block copolymers are contemplated herein including diblock copolymers (i.e., polymers including two polymer blocks), triblock copolymers (i.e., polymers including three polymer blocks), multiblock copolymers (i.e., polymers including more than three polymer blocks), and combinations thereof.

A self-assembling block copolymer typically contains two or more different polymeric block components, for example components A and B, that are at least partially immiscible with one another. Under suitable conditions, the two or more at least partially immiscible polymeric block components segregate into two or more different phases or microdomains. The microdomains occur on the 5 to 300 nanometer scale and thereby form ordered patterns of isolated nano-sized structural units. There are many types of block copolymers that can be used for forming the self-assembled periodic patterns.

Embodiments include junction-functionalized block copolymers that can be used in processes designed to form periodic nanometer (nm) scale features. For example, for lithographic applications, junction-functionalized block copolymers can provide a robust and highly selective mask for standard plasma etching techniques, such as oxygen reactive ion etching. As used herein, the term "junction-functionalized block copolymer" refers to a block copolymer having one or more junctions between blocks, the junction(s) having one or more functional groups that impart chemical and/or physical properties to the block copolymer. In some cases, a block copolymer can be modified to produce a junction-functionalized block copolymer. In such a case, an existing block copolymer includes a junction that is susceptible to chemical modification (functionalization). In some embodiments, the junction can include an oligomeric segment between the blocks, which can impart chemical and/or physical properties to the block copolymer, or are susceptible to chemical modification to impart chemical and/or physical properties.

Block copolymers can be junction-functionalized using ATRP or RAFT techniques. (1), (2) Other methods take advantage of coupling to introduce a functionality at the junction (generally a hydrogen bonding group or a rigid liquid crystalline segment)(3). Copper catalyzed azide-alkyne cycloaddition (CuAAC) has been used for block copolymer coupling, as it advantageously is chemoselective, efficient, and tolerates a wide range of functionalities. (4) Block copolymers prepared by the CuAAC method contain a 1,2,3-triazole linker at the junction between blocks. The resulting triazole group can be subsequently alkylated. (5), (6). In some embodiments, a junction-functionalized block copolymer includes a first polymer block joined to a second polymer block by a junction, where the junction includes one or more electrostatically charged moieties. The block copolymer can be described with the formula (I):

$$A-J-B \quad (I)$$

where A is a first polymer block, B is a second polymer block, where the A block and the B block are chemically dissimilar, and J is a junction linking the A block to the B block and including one or more electrostatically charged moieties. The chemical dissimilarity between the A block and the B block can favor segregation of the blocks. In some embodiments, the block copolymer can include additional blocks, which may be linked via a junction which is the same as, or different from, the junction J between the A and B blocks.

The junction can include an oligomeric segment. The oligomeric segment can include a number of repeating monomeric units, for example, from 1 to 10 units, from 1 to 5 units, or from 1 to 3 units, where one or more of the units includes an electrostatically charged moiety. Thus, in some embodiments, the junction includes from 1 to 10 electrostatically charged moieties, from 1 to 5 electrostatically charged moieties, or from 1 to 3 electrostatically charged moieties. The oligomeric segment can be smaller (e.g., in size, molecular weight, and/or number of repeating units) than the A block and/or the B block.

In some embodiments of the invention, the block copolymers can be prepared by sequential polymerization and/or coupling of i) a first polymer block A, ii) an oligomeric segment containing one or more electrostatically charged moieties, or one or more moieties susceptible to becoming electrostatically charged after chemical modification, iii) a second polymer block B.

The polymers identified below are provided as examples of chemical structures useful in one or more embodiments. These are non-limiting examples, and it is understood that a large number of different chemical blocks and junctions can be combined together in order to form a wide variety of different embodiments.

Illustrative polymer block constituents include: a poly((meth)acrylate), a poly(siloxane), a polyether (e.g., a poly(alkylene oxide)), a poly(styrene), a poly(cyclic olefin), a polyester, a polyamide, a polyacrylamide, a polyimide, a polyurethane, a polysulfone, a polycarbonate, or a combination thereof. Similarly, by way of additional non-limiting examples, the block copolymer can also include one or more of: a poly(styrene), a poly(4-hydroxystyrene), a poly(dimethylsiloxane), poly(ferrocenyldimethylsilane) (PFS), poly(trimethylsilylstyrene) (PTMSS), poly(3-tri(methoxysilyil)propyl methacrylate), poly(3-acryloxypropyltrimethoxysilane), poly(methylsilsesquioxane) and the like, poly(dimethylsilazane), poly(tetramethyl-p-silphenylene siloxane), poly(allyldimethylsilane), a poly(4-vinylpyridine), a poly(methyl methacrylate), a poly(ethylene oxide), a poly(isoprene), a poly(butadiene), a poly(lactic acid), a poly(2-vinylpyridine), and combinations thereof. As additional nonlimiting examples, polymeric blocks that may be used for forming the block copolymers of the invention can include, for example, polystyrene-block-polydimethylsiloxane (PS-b-PDMS), polystyrene-block-poly(4-vinylpyridine) (PS-b-4PVP), polystyrene-block-poly(9,9-bis(6'-N,N,N-trimethylammonium)-hexyl)-fluorene phenylene) (PS-b-PFP), polystyrene-block-polymethylmethacrylate (PS-b-PMMA), polyethyleneoxide-block-polyisoprene (PEO-b-PI), polyethyleneoxide-block-polybutadiene (PEO-b-PBD), polyethylene oxide-block-polystyrene (PEO-b-PS), polyethyleneoxide-block-polymethylmethacrylate (PEO-b-PMMA), polyethyleneoxide-block-polyethylethylene (PEO-b-PEE), polystyrene-block polyisoprene (PS-b-PI), polystyrene-block-polybutadiene (PS-b-PBD), polystyrene-block-polyferrocenyldimethylsilane (PS-b-PFS), polybutadiene-block-polyvinylpyridine (PBD-b-PVP), and polyisoprene-block-polymethylmethacrylate (PI-b-PMMA).

In certain embodiments of the invention, polymeric blocks used in embodiments of the invention comprise poly(9,9-bis(6'-N,N,N-trimethylammonium)-hexyl)-fluorene phenylene) (PFP), polydimethylsiloxane (PDMS), poly(4-vinylpyridine) (4PVP), hydroxypropyl methylcellulose (HPMC), polyethylene glycol (PEG), poly(ethylene oxide)-copoly(propylene oxide) di- or multiblock copolymers, poly(vinyl alcohol) (PVA), poly(ethylene-co-vinyl alcohol), poly(acrylic acid), poly(ethyloxazoline), a poly(alkylacrylate), poly(acrylamide), a poly(N-alkylacrylamide), a poly(N,N-dialkylacrylamide), poly(propylene glycol) (PPG), poly(propylene oxide), partially or fully hydrolyzed poly(vinyl alcohol), dextran, polystyrene (PS), polyethylene (PE), polypropylene (PP), polychloroprene (CR), a polyvinyl ether, poly(vinyl acetate), poly(vinyl chloride) (PVC), a polysiloxane, a polyurethane (PU), a polyacrylate, and a polyacrylamide.

Illustrative block copolymers include, for example, a poly(dimethyl siloxane)-poly(methyl methacrylate) (MMA) copolymer, a poly(ethylene oxide)-poly(methyl methacrylate) (MMA) copolymer, a polystyrene-poly(dimethyl siloxane) copolymer, a poly(dimethyl siloxane)-methyl methacrylate (MMA) copolymer, a poly(dimethyl siloxane)-methyl acrylate copolymer, a poly(dimethyl siloxane)-ethyl acrylate copolymer, a methyl acrylate-isobornyl acrylate-poly(dimethyl siloxane) copolymer, a polystyrene-poly(dimethyl siloxane) copolymer, a poly(cyclic olefin)-poly(dimethyl siloxane) copolymer, a polysiloxane-polyester copolymer, a polysiloxane-polyamide copolymer, polysiloxane-polyimide copolymer, a polysiloxane-polyurethane copolymer, a polysiloxane-polysulfone copolymer, a polysiloxane-polyether copolymer, and a polysiloxane-polycarbonate copolymer.

In some embodiments, the A block and the B block are each independently selected from a poly((meth)acrylate), a poly (styrene), a poly(alkylene oxide), and a poly(siloxane); for example, the A block can include a poly((meth)acrylate), a poly(styrene), or a poly(alkylene oxide), and the B block can include a poly(siloxane). In some embodiments, A block is poly(methyl methacrylate) and the B block is poly(dimethylsiloxane).

In some embodiments, J is a triazolium moiety. The triazolium moiety can include an N-alkyl, N-alkenyl, N-alkynyl, N-cycloalkyl, N-heterocyclyl, N-aryl, or N-heteroaryl moiety. In some embodiments, the triazolium moiety includes an N-alkyl moiety. In some embodiments, the alkyl group is an $C_1$-$C_6$ alkyl group, and is optionally substituted. The alkyl group can be substituted with one or more halogens, such as F, Cl, Br, or I, and in some cases the alkyl group can be a perhaloalkyl group. Thus, in some embodiments, J is an N-alkyl triazolium moiety, such as N-methyl triazolium.

The block copolymer can include a counterion associated with the electrostatically charged moiety of the junction. In some embodiments, the electrostatically charged moiety of the junction carries a positive charge (as in the case of, for example, a triazolium moiety), and the counterion is negatively charged; however, the opposite configuration is also possible. Suitable negatively charged counterions include, but are not limited to, $F^-$, $Cl^-$, $Br^-$, $I^-$, $BF_4^-$, $PF_6^-$, $Tf_2N^-$, $SbF_6^-$, $OTf^-$, $CN^-$, $OH^-$, $RSO_3^-$, $RCF_2SO_3^-$, $RCOO^-$, $SO_4^{2-}$, $SiO_4^{2-}$, $PO_4^{3-}$, and multi-functional anions, for example, bis-anions: $^-O_3S-R-SO_3^-$, or $^-OOC-R-COO^-$.

In some embodiments, the electrostatically charged moieties of the junction can be obtained from polymerizable monomers including an electrostatically charged moiety, or can be obtained after post-polymerization chemical modifications from monomers that do not include an electrostatically charged moiety. Suitable monomers can include ionic liquid monomers (ILMs), for example, methacryloyl based ILMs such as 1-[(2-methacryloyloxy)-ethyl]-3-butylimidazolium bromide; N-vinyl imidazolium based ILMs such as 3-methyl-1-vinylimidazolium iodide; styrenic ILMs such as 1-(4-Vinylbenzyl)-3-butyl imidazolium chloride; and vinyl triazolium ILMs such as 1-Benzyl-3-methyl-4-vinyl-triazolium bis(trifluoromethanesulfonyl)amide.

In certain embodiments, the block copolymer has a molecular weight of about 40,000 g/mol or less. In other embodiments of the invention, the block copolymer has a molecular weight of about 20,000 g/mol or less, about 10,000 g/mol or less, about 5,000 g/mol or less, or about 4,000 g/mol or less.

The term "alkyl" used alone or as part of a larger moiety (i.e. "alkoxy," "hydroxyalkyl," "alkoxyalkyl," and "alkoxycarbonyl") includes both straight and branched chains containing one to ten carbon atoms (i.e. 1, 2, 3, 4, 5, 6, 7, 8, 9, or 10 carbon atoms). Examples of alkyl groups include methyl (Me), ethyl (Et), propyl (Pr) (including n-propyl ($^n$Pr or n-Pr), isopropyl ($^i$Pr or i-Pr), butyl (Bu) (including n-butyl ($^n$Bu or n-Bu), isobutyl ($^i$Bu or i-Bu), and tert-butyl ($^t$Bu or t-Bu)), pentyl (Pe) (including n-pentyl) and so forth. An alkyl group may be optionally substituted by 1 one 6 substituents selected from halo, hydroxy, thiol, oxo, amino, alkylamino, dialkylamino, cyano, nitro, alkyl, alkoxy, alkenyl, alkynyl, cycloalkyl, heterocyclyl, aryl, or heteroaryl.

The term "alkenyl" used alone or as part of a larger moiety includes both straight and branched chains containing at least one double bond and two to ten carbon atoms (i.e., 2, 3, 4, 5, 6, 7, 8, 9, or 10 carbon atoms), as well as cyclic, non-aromatic alkenyl groups such as cyclopropenyl, cyclobutenyl, cyclopentenyl, cyclopentadienyl, cyclohexenyl, cyclohexadienyl, etc. As used herein, alkenyl groups also include mixed cyclic and linear alkyl groups, such as cyclopentenylmethyl, cyclopentenylethyl, cyclohexenylmethyl, etc., so long as the total number of carbon atoms is not exceeded. When the total number of carbons allows (i.e., more than 4 carbons), an alkenyl group may have multiple double bonds, whether conjugated or non-conjugated, but do not include aromatic structures. Examples of alkenyl groups include ethenyl, propenyl, butenyl, butadienyl, isoprenyl, dimethylallyl, geranyl and so forth. An alkenyl group may be optionally substituted by 1 one 6 substituents selected from halo, hydroxy, thiol, oxo, amino, alkylamino, dialkylamino, cyano, nitro, alkyl, alkoxy, alkenyl, alkynyl, cycloalkyl, heterocyclyl, aryl, or heteroaryl.

The term "alkynyl" used alone or as part of a larger moiety includes straight and branched chains groups containing at least one triple bond and two to ten carbon atoms (i.e., 2, 3, 4, 5, 6, 7, 8, 9, or 10 carbon atoms). When the total number of carbon atoms allows (i.e., more than 4 carbons), an alkynyl group may have multiple triple bonds, whether conjugated or non-conjugated, but do not include aromatic structures. An alkynyl group can include more than one type of multiple bond, i.e., an alkynyl group can include one or more double bonds in addition to at least one triple bond. Examples of alkenyl groups include ethynyl, propynyl, but-2-yn-yl, but-3-ynyl, and so on. An alkynyl group may be optionally substituted by 1 one 6 substituents selected from halo, hydroxy, thiol, oxo, amino, alkylamino, dialkylamino, cyano, nitro, alkyl, alkoxy, alkenyl, alkynyl, cycloalkyl, heterocyclyl, aryl, or heteroaryl.

The term "cycloalkyl" includes mono-, bi-, or tricyclic non-aromatic carbocyclic ring systems having from 3 to 14 ring carbons, and optionally one or more double bonds. The ring systems may be fused, bridged, or spiro ring systems, or a combination of these. Examples of cycloalkyl groups include saturated monocyclic groups such as cyclopropyl, cyclobutyl, cyclopentyl, cyclohexyl, cycloheptyl, cyclohexyl, cycloheptyl, cyclooctyl, and the like; unsaturated monocyclic groups such as cyclopentenyl, cyclohexenyl, cycloheptenyl, cyclopentadienyl, cyclohexadienyl, cycloheptadienyl, cyclooctatetraenyl, and the like. Examples of cycloalkyl groups also include saturated bicyclic groups such as decahydronaphthalene, bicyclo[3.1.1]heptyl, norbornane, bicyclo[2.2.2]octyl, and the like; unsaturated bicyclic groups such as norbornenyl, bicyclo[2.2.2]oct-2-enyl, and the like. Examples of cycloalkyl groups also include saturated tricyclic groups such as tetradecahydroanthracene, tetradecahydrophenanthrene, dodecahydro-s-indacene, and the like, and unsaturated tricyclic groups. Also included within the scope of the term "cycloalkyl" are spiro ring systems, such as spiro [4.4]nonyl, spiro[4.5]decyl, spiro[5.5]undecyl, spiro[4.6]undecyl, and the like. Also included within the scope of the term "cycloalkyl" is a group in which a non-aromatic carbocyclic ring is fused to one or more aromatic or non-aromatic rings, such as in a tetrahydronaphthyl or indanyl group, where the radical or point of attachment is on the non-aromatic carbocyclic ring. A cycloalkyl group may be optionally substituted by 1 one 6 substituents selected from halo, hydroxy, thiol, oxo, amino, alkylamino, dialkylamino, cyano, nitro, alkyl, alkoxy, alkenyl, alkynyl, cycloalkyl, heterocyclyl, aryl, or heteroaryl.

The term "heterocycle", "heterocyclyl", or "heterocyclic" unless otherwise indicated includes mono-, bi-, or tricyclic non-aromatic ring systems having five to fourteen members, preferably five to ten, in which one or more ring carbons, preferably one to four, are each replaced by a heteroatom such as N, O, or S. Examples of heterocyclic groups include 3-1H-benzimidazol-2-one, (1-substituted)-2-oxo-benzimidazol-3-yl, 2-tetrahydrofuranyl, 3-tetrahydrofuranyl, 2-tetrahydropyranyl, 3-tetrahydropyranyl, 4-tetrahydropyranyl, [1,3]-dioxalanyl, [1,3]-dithiolanyl, [1,3]-dioxanyl, 2-tetrahydrothiophenyl, 3-tetrahydrothiophenyl, 2-morpholinyl, 3-morpholinyl, 4-morpholinyl, 2-thiomorpholinyl, 3-thiomorpholinyl, 4-thiomorpholinyl, 1-pyrrolidinyl, 2-pyrrolidinyl, 3-pyrrolidinyl, 1-piperazinyl, 2-piperazinyl, 1-piperidinyl, 2-piperidinyl, 3-piperidinyl, 4-piperidinyl, 4-thiazolidinyl, diazolonyl, N-substituted diazolonyl, 1-phthalimidinyl, benzoxanyl, benzopyrrolidinyl, benzopiperidinyl, benzoxolanyl, benzothiolanyl, and benzothianyl. Also included within the scope of the term "heterocyclyl" or "heterocyclic", as it is used herein, is a group in which a non-aromatic heteroatom-containing ring is fused to one or more aromatic or non-aromatic rings, such as in an indolinyl, chromanyl, phenanthridinyl, or tetrahydroquinolinyl, where the radical or point of attachment is on the non-aromatic heteroatom-containing ring. The term "heterocycle", "heterocyclyl", or "heterocyclic" whether saturated or partially unsaturated, also refers to rings that are optionally substituted.

The term "aryl" used alone or as part of a larger moiety, refers to mono-, bi-, or tricyclic aromatic hydrocarbon ring systems having five to fourteen members, such as phenyl, 1-naphthyl, 2-naphthyl, 1-anthracyl and 2-anthracyl. The term "aryl" may be used interchangeably with the term "aryl ring". "Aryl" also includes fused polycyclic aromatic ring systems in which an aromatic ring is fused to one or more rings. Examples include 1-naphthyl, 2-naphthyl, 1-anthracyl and 2-anthracyl. Also included within the scope of the term "aryl", as it is used herein, is a group in which an aromatic ring is fused to one or more non-aromatic rings, such as in an indanyl, phenanthridinyl or tetrahydronaphthyl, where the radical or point of attachment is on the aromatic ring.

The term "heteroaryl", used alone or as part of a larger moiety, refers to heteroaromatic ring groups having five to fourteen members, preferably five to ten, in which one or more ring carbons, preferably one to four, are each replaced by a heteroatom such as N, O, or S. Examples of heteroaryl rings include 2-furanyl, 3-furanyl, N-imidazolyl, 2-imidazolyl, 4-imidazolyl, 5-imidazolyl, 3-isoxazolyl, 4-isoxazolyl, 5-isoxazolyl, 2-oxadiazolyl, 5-oxadiazolyl, 2-oxazolyl, 4-oxazolyl, 5-oxazolyl, 1-pyrrolyl, 2-pyrrolyl, 3-pyrrolyl, 1-pyrazolyl, 3-pyrazolyl, 4-pyrazolyl, 2-pyridyl, 3-pyridyl, 4-pyridyl, 2-pyrimidyl, 4-pyrimidyl, 5-pyrimidyl, 3-pyridazinyl, 2-thiazolyl, 4-thiazolyl, 5-thiazolyl, 5-tetrazolyl, 2-triazolyl, 5-triazolyl, 2-thienyl, 3-thienyl, carbazolyl, benzimidazolyl, benzothienyl, benzofuranyl, indolyl, quinolinyl, benzotriazolyl, benzothiazolyl, benzooxazolyl, benzimidazolyl, isoquinolinyl, indazolyl, isoindolyl, acridinyl, or benzoisoxazolyl. Also included within the scope of the term "heteroaryl", as it is used herein, is a group in which a heteroaromatic ring is fused to one or more aromatic or nonaromatic rings where the radical or point of attachment is on the heteroaromatic ring. Examples include tetrahydroquinolinyl, tetrahydroisoquinolinyl, and pyrido[3,4-d]pyrimidinyl. The term "heteroaryl" may be used interchangeably with the term "heteroaryl ring" or the term "heteroaromatic."

Embodiments of the block copolymers are useful in, for example, lithographic processes. In block copolymer lithography, polymer masks formed by self-assembly of block copolymers can be used as an etch mask in semiconductor device fabrication. Block copolymers are known to form nano-scale microdomains by microphase segregation. In the fabrication of the block copolymer, the microdomains may rearrange into a self-assembled array by microphase segregation to achieve a thermodynamic equilibrium state by, for example, treating the block copolymer with heat and/or a solvent. When cast on a substrate and treated, block copolymers form nano-scale periodic patterns. Such ordered patterns of isolated structural units formed by the self-assembled block copolymers may potentially be used for fabricating periodic structural units and, therefore, have promising applications in, for example, semiconductor, optical, and magnetic devices. Dimensions of the structural units so formed are typically in the range of 5 nm to 100 nm, which dimensions are extremely difficult to define using conventional lithographic techniques. As discussed below, the size, shape and other characteristics of these domains may be modulated by controlling the constituents of the block copolymer compositions.

FIG. 1A schematically depicts a composite structure 100 for forming a patterned substrate, which includes substrate 110. Layered substrate 110 is depicted as including a first layer 120 and a second layer 130. However the invention is not limited to this example. In some embodiments, the layered substrate 110 could be a single layer, or have more than two layers. Disposed over layered substrate 110 is mask layer 140, which includes a block copolymer. In some embodiments, the mask layer 140 consists essentially of a block copolymer, while in other embodiments, mask layer 140 includes a block copolymer in combination with one or more additional components. The block copolymer in mask layer 140 is illustrated with a block-segregated configuration, i.e., such that one block (e.g., A blocks) are grouped with one another in A domains 150, while other blocks (e.g., B blocks) are grouped with one another in B domains 160. While a periodic pattern arising from a diblock copolymer (e.g., an A-B copolymer) is illustrated in FIG. 1A, the invention is not limited to this example. Other configurations are contemplated, such as using A-B-A block copolymers, A-B-C block copolymers, other block copolymer structures, or configurations where the copolymers form patterns other than the lateral periodic pattern illustrated. Domains 150 and 160 can each independently have dimensions of, for example, between about 5 nm and about 300 nm, or between about 5 nm and 100 nm.

Embodiments include nanolithographic methods (e.g. methods designed to form structures having features between about 5 nm and about 300 nm, or between about 5 nm and 100 nm, in size). In some embodiments, such methods include forming a layer of a mask material over a substrate, where the mask material includes a block copolymer including a first polymer block joined to a second polymer block by a junction, where the junction includes one or more electrostatically charged moieties. In such methods, electrostatic interactions between junction moieties of adjacent block copolymer molecules favor the formation of nanostructures having a reduced interfacial width and improved long-range ordering.

In embodiments of the invention where the substrate comprises one or more layers of material, such layers can comprise materials commonly used in lithographic processes and/or semiconductor fabrication processes. For example, in some embodiments of the invention, such layers of material can include, for example, a substrate layer that is part of a full or partial wafer of semiconductor material and/or a material such as glass or sapphire. The layer of material can include a dielectric material and/or a semiconductive material and/or an insulative material. The material can also be a magnetic recording medium. The dielectric material may be provided over and in contact with a surface of the base substrate. By way of example and not limitation, the dielectric material may include silicon oxynitride (SiON), silicon nitride, silicon dioxide, another oxide material, or a polymer material. The semiconductive material can include, for example, a doped polysilicon material and may be formed over and in contact with the dielectric material using conventional techniques. The insulative material can be formed over the semiconductive layer and can include an oxide such as silicon dioxide. The magnetic recording medium can be comprised of a film stack with different components, containing for example layers of CoZrNb and CoPt alloys separated by a Ru layer. Lithographic methods of the invention can include additional steps such as annealing the mask material on the substrate followed by one or more etching steps.

The term "annealing" or "anneal" as used herein means and includes treatment of the block copolymer so as to enable sufficient microphase segregation between the two or more different polymeric block components of the block copolymer to form an ordered pattern defined by repeating structural units formed from the polymer blocks. Annealing of the block copolymer may be achieved by various methods known in the art, including, but not limited to: thermal annealing (either under ambient atmospheric conditions, or in a vacuum or in an inert atmosphere, such as nitrogen or argon), solvent vapor-assisted annealing (either at or above room temperature), or supercritical fluid-assisted annealing. As a specific example, thermal annealing of the block copolymer may be conducted by exposing the block copolymer to an elevated temperature that is above the glass transition temperature (Tg), but below the degradation temperature (Td) of the block copolymer.

In the lithographic methods according to some embodiments, the annealed mask material can then be exposed to an etching process selected for its ability to etch the block copolymer in a manner that exposes a portion of the layered substrate (e.g., oxygen reactive ion etching). Certain embodiments can further include exposing the resist material to a further etching process selected for its ability to etch the portion of the substrate exposed by the previous etching step(s). Embodiments can include additional steps, for example those designed to remove remaining polymer following the formation of the etched substrate material. In these methods, structures having features between about 5 nm and about 300 nm, or between about 5 nm and 100 nm, in size can be formed. Such features include width, height, length, diameter, as well as the distances between elements. In some embodiments, structures formed by these methods can comprise apertures, pores, channels, columns, wires, or combinations thereof.

In some embodiments, the block copolymer is applied onto a substrate comprising one or more layers of materials. For example, the block copolymer, or a solution of the block copolymer, can be applied by spin-coating to form a thin and uniform layer. In some embodiments, the block copolymer can be applied by dip-coating, spray-coating, applying liquid droplets, or other appropriate coating methods known in the art.

Embodiments include lithography systems such as those that provide a substrate that can comprise one or more layers of material (e.g. one comprising a polystyrene, a stainless steel, a glass, a silicon oxide material etc.) and a mask composition disposed over the layered substrate. As used herein, the term "substrate" means and includes base materials upon which compositions of the invention are disposed. The substrate can include materials used in semiconductor substrates, base semiconductor layers on a supporting structure, a metal electrode or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. One or more substrate layers may be doped or undoped.

Related embodiments can include structures useful in semiconducting devices including, for example, one or more typical semiconductor elements such as a substrate, a dielectric material, a semiconductive material, and an insulative material. In some embodiments of the invention, the substrate can comprise layers of these materials on which a composition of the invention is disposed and can comprise a full or partial wafer of semiconductor material or a material such as glass or sapphire. By way of example and not limitation, a layered substrate may include silicon oxynitride (SiON), silicon nitride, silicon dioxide, another oxide material, or a polymer material, and may be formed using, for example, chemical vapor deposition (CVD), physical vapor deposition (PVD), or atomic layer deposition (ALD).

As noted above, embodiments can be used for the fabrication of organized structures with features between about 5 nm and about 300 nm, or between about 5 nm and 100 nm, in size. In some embodiments, lithography systems are used to fabricate repeating structures having features that are between about 5 nm and about 100 nm in size. Such structures can include, for example, tunnels or pores having a diameter of less than about 100 nm, less than about 50 nm, less than about 25 nm, or less than about 10 nm (and/or a depth of less than about 5 nm, less than about 10 nm, or less than about 15 nm); channels or troughs having a width of less than about 100 nm, less than about 50 nm, less than about 25 nm, or less than about 10 nm (and/or a depth in a range of from about 5, about 10 or about 15 nm to about 50 nm); ridges or columns having a width of less than about 100 nm, less than about 50 nm, less than about 25 nm, or less than about 10 nm (and/or a height in a range from about 5 nm, about 10 nm or about 15 nm to about 50 or about 100 nm); or wires having a diameter of less than about 100 nm, less than about 50 nm, less than about 25 nm, or less than about 10 nm. Such nanolithographic features are well known in the art and can be used in a wide range of applications, such as porous silicate structures, membranes back-filled with liquids, semiconductor fabrication and the like (see, e.g. U.S. Patent Application Publication Nos. 2008/0182402, 2009/0273051, 2009/0202952 and 2012/0273762, each of which is incorporated herein by reference). In some embodiments, block copolymer layers can be used to produce a template with nanoscale structures.

EXAMPLES

The diblock copolymer poly(methyl methacrylate)-block-poly(dimethylsiloxane) ($PMMA_{2.5k}$-$PDMS_{2k}$) was synthesized from alkyne-terminated PMMA and azide-terminated PDMS by coupling the two blocks with copper catalyzed azide-alkyne cycloaddition (CuAAC). The resulting diblock copolymer contained a triazole group at the junction between the blocks.

When the triazole group was alkylated, the resulting diblock copolymer displayed enhanced ordering and had a narrower interfacial width compared to the original non-alkylated diblock copolymer. This property can be generalized to any block copolymer where the junction contains an ionic pair. Different methods to functionalize a block copolymer junction can also be used.

Synthesis of PDMS with Azide as End Group 20 g of hexamethylcyclotrisiloxane (D3) monomer was dried by 500 mg of NaH in a Schlenk tube over night at 80° C. The pure D3 monomer was distilled bulb to bulb to a 3 neck round bottom flask which was cooled by a liquid $N_2$ bath. The net weight of pure D3 monomer was 13.8 g. 200 ml of THF was added into the flask. 10 ml of 1.4 M s-BuLi was added into the solution at room temperature in one portion. After 2 hours, 4.5 ml of chloro(3-chloropropyl)dimethylsilane was added to quench the reaction. 10 hours later, the mixture was precipitated in 500 ml of methanol/$H_2O$ mixture twice. The resulting PDMS-Cl was dissolved in 1:1 DMF/DME solution. 10 equivalents of $NaN_3$ was added into the mixture and the whole solution was heated to 90° C. for 24 h. The mixture was washed with $H_2O$ twice. The organic layers were dried by high vacuum pump overnight.

Synthesis of PMMA with Alkyne as End Group

CuCl (0.049 g, 0.504 mmol), PMDETA (0.087 g, 0.504 mmol), propargyl α-bromoisobutyrate (0.103 g, 0.504 mmol), methyl methacrylate (5.05 g, 50.43 mmol) and 5 ml of toluene as a solvent were placed in a Schlenk tube. Three freeze-pump-thaw cycles were performed. The reaction was allowed to stir at 70° C. for specific time depending on the desired molecular weight. The reaction was opened to air and cooled in an ice bath. THF was added to the reaction vessel to dilute the solution. Neutral alumina column chromatography was performed to remove copper catalyst. Then the solution was precipitated in hexane and the solid was collected after filtration and dried by high vacuum pump overnight.

Synthesis of PEO with Alkyne as End Group 1.1 equivalent of NaH was slowly added into a THF solution of poly(ethylene glycol)methyl ether at 0° C. under Ar. The reaction was heated to 50° C. for 30 min. 1.1 equivalents of propargyl bromide was added to the reaction mixture and the solution was allowed to stir at room temperature overnight. The solution was precipitated with hexane and the solid was collected after filtration and dried by high vacuum pump overnight.

Synthesis of PMMA-Triazole-PDMS

Alkyne-terminated poly(methyl methacrylate) (alkyne-PMMA, 2.5 k) and azide terminated poly(dimethyl siloxane) (azide-PDMS, 2 k) were synthesized from methods known in the literature. The CuAAC coupling was realized using previously described methods (with Cu nanoparticles as catalyst, 30 min at 140° C. in microwave). All reactions were conducted in toluene. Purification, and especially the removal of homopolymers, was achieved by several precipitations in solvent/non-solvent mixtures and monitored with GPC (PDI=1.13).

Synthesis of PMMA-Triazolium-PDMS

Figure 1B:
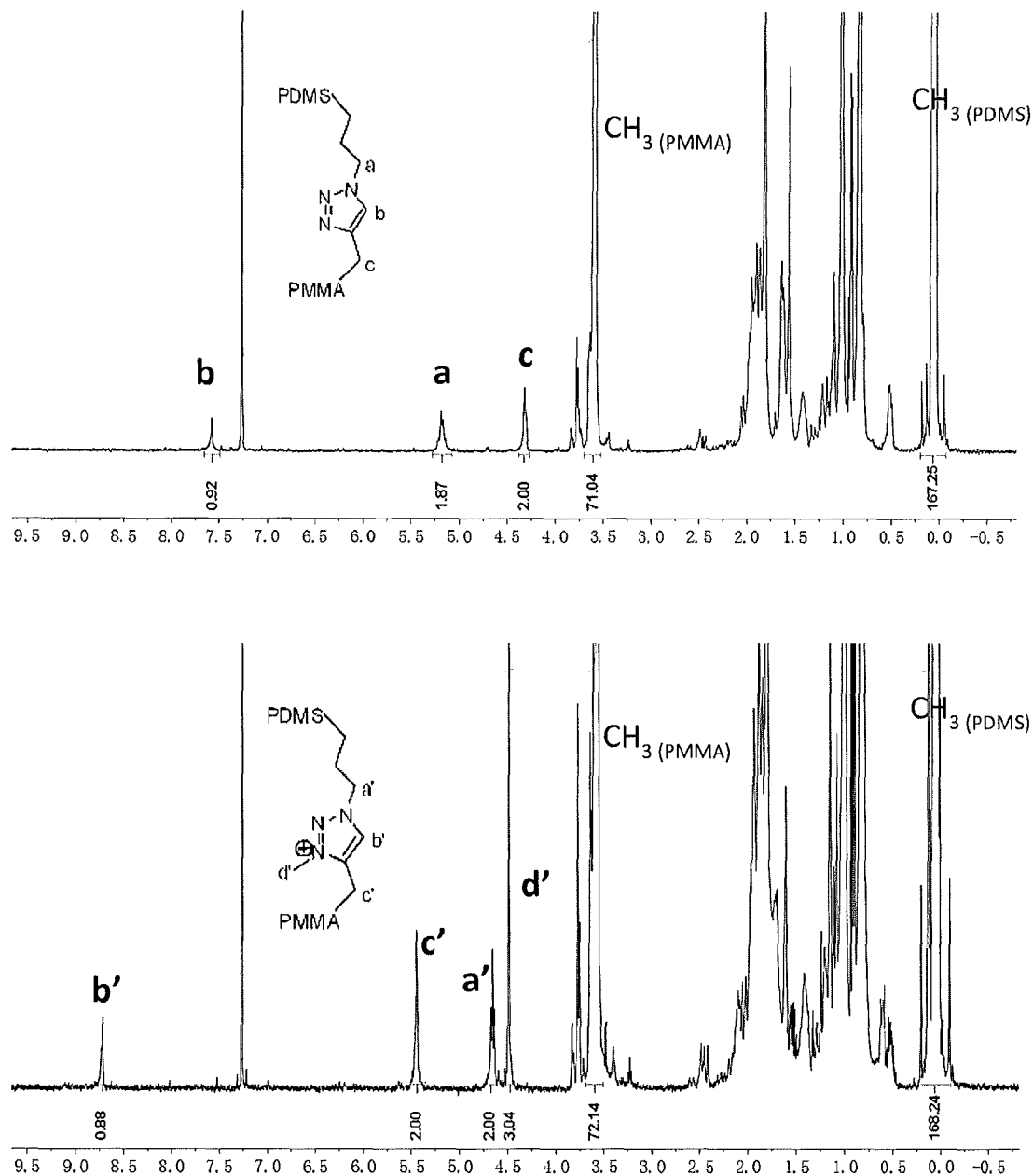
FIG. 1B shows the NMR spectra of PMMA-triazole-PDMS (on top) and PMMA-methyltriazolium iodide-PDMS (bottom).

Alkylation of the triazole group was realized with MeI (10 eq in $CH_3CN$, overnight). Excess MeI was removed under reduced pressure and completion of the reaction was confirmed with $^1$H NMR (FIG. 1B).

Figure 3:
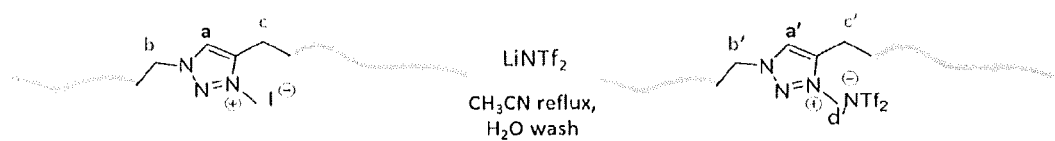
FIG. 3 schematically illustrates the preparation of PDMS-triazolium-triflimide-PMMA.
Figure 4A:
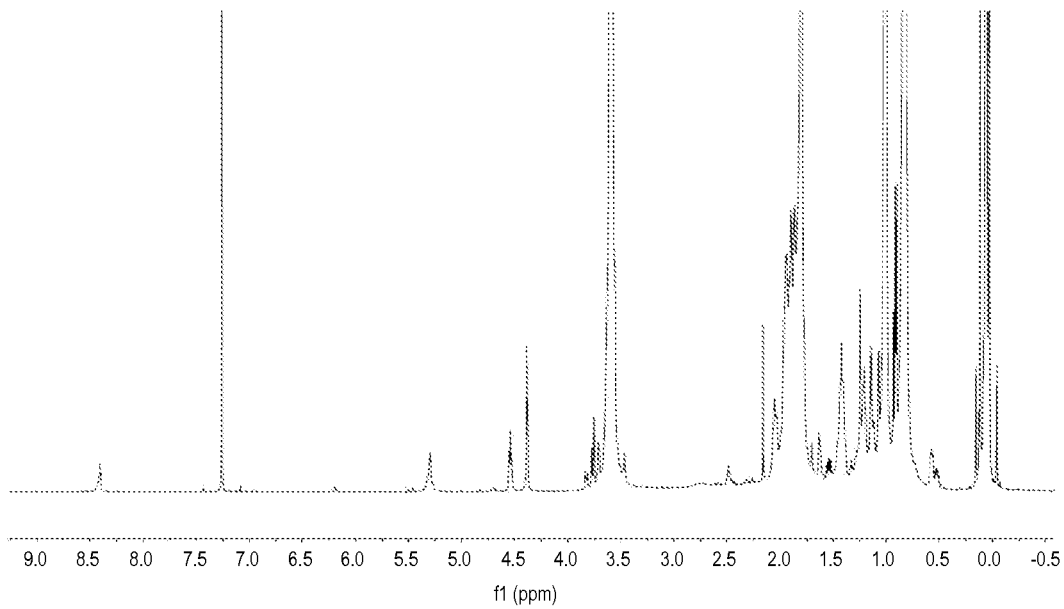
FIGS. 4A-4B show $^1$H and $^{19}$F, respectively, NMR spectra of PDMS-triazolium-triflimide-PMMA.
Figure 4B:
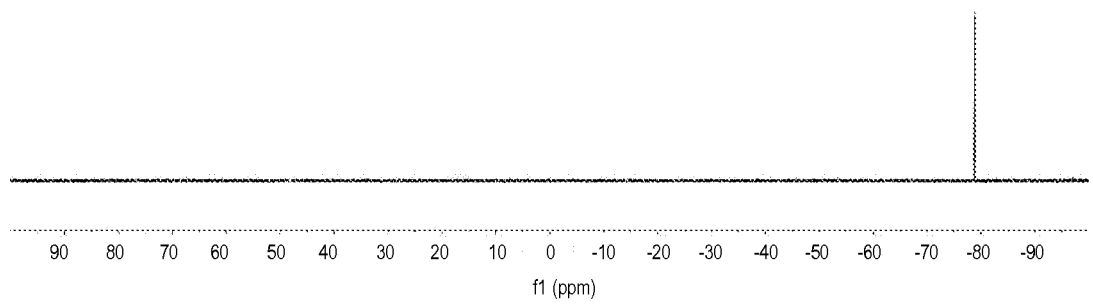

Synthesis of PDMS-Triazolium-Triflimide-PMMA 1 equivalent of PDMS-triazolium-iodide-PMMA and 1.2 equivalent of lithium triflimide ($LiNTf_2$) was dissolved in acetonitrile. The solution was refluxed for 12 h at 80° C. The resulting solution was diluted with ethyl acetate and washed with water twice. The organic layer was dried by high vacuum pump overnight. See FIG. 3 and FIGS. 4A-4B.

Figure 5:
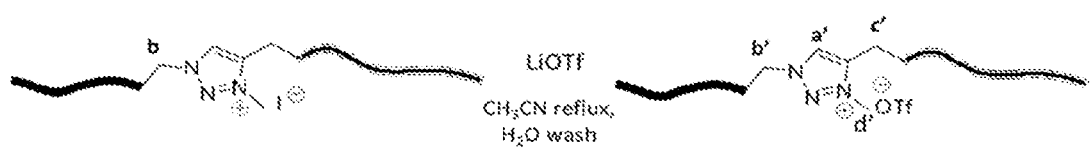
FIG. 5 schematically illustrates the preparation of PDMS-triazolium-triflate-PMMA.
Figure 6A:
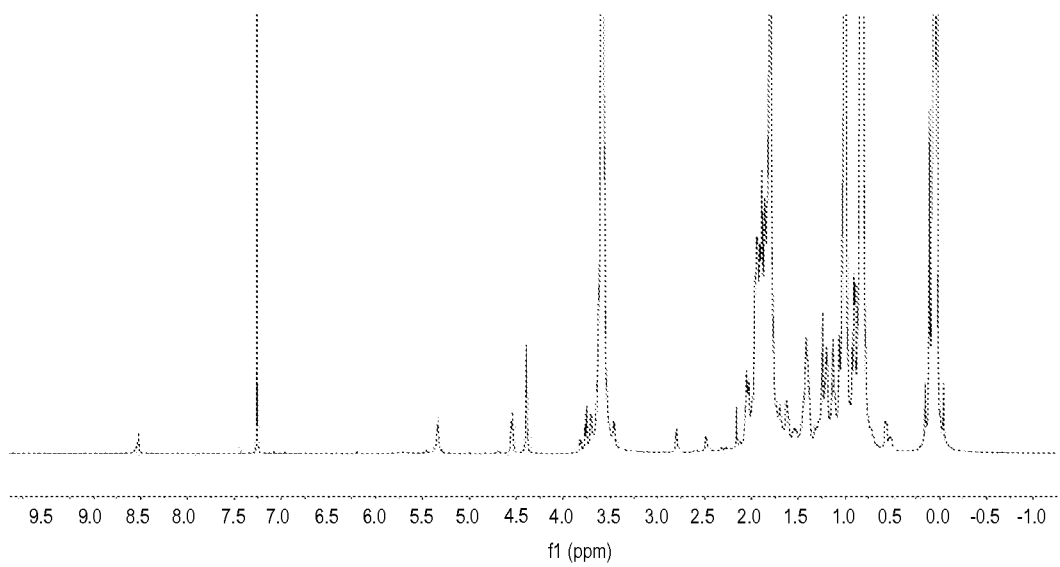
FIGS. 6A-6B show $^1$H and $^{19}$F, respectively, NMR spectra of PDMS-triazolium-triflate-PMMA.
Figure 6B:
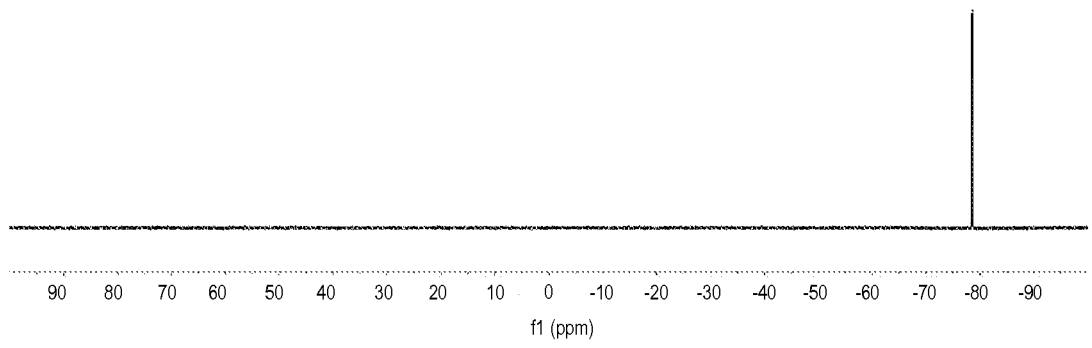

Synthesis of PDMS-Triazolium-Triflate-PMMA 1 equivalent of PDMS-triazolium-iodide-PMMA and 1.2 equivalent of lithium triflate was dissolved in acetonitrile. The solution was refluxed for 12 h at 80° C. The resulting solution was diluted with ethyl acetate and washed with water twice. The organic layer was dried by high vacuum pump overnight. See FIG. 5 and FIGS. 6A-6B.

Structure Characterization

Block copolymers were annealed under vacuum at 110° C. for 24 h. Small Angle X-Ray scattering was carried out at the Advanced Photon Source laboratory (APS, Argonne, Line 8-ID-E).

Figure 2:
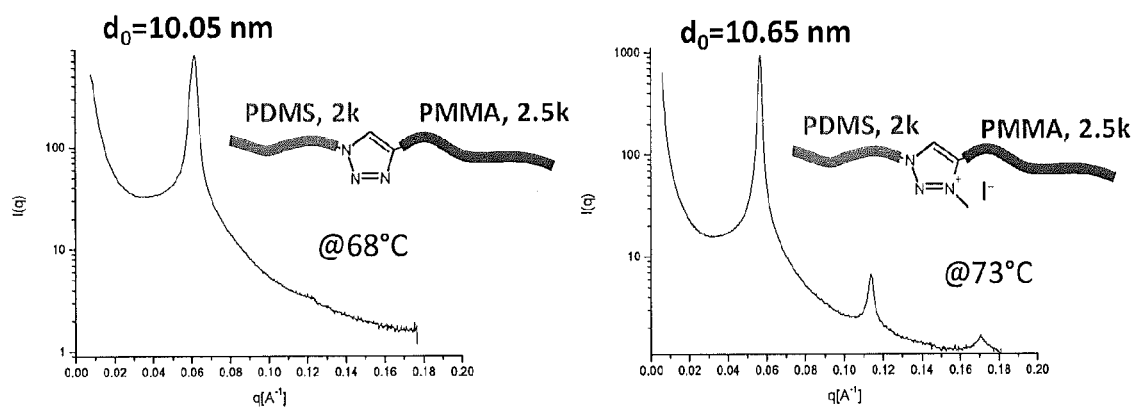
FIG. 2 shows SAXS spectra of PMMA-triazole-PDMS (left) and PMMA-methyltriazolium iodide-PDMS (right).

As shown in FIG. 2, The SAXS spectrum of PMMA-triazole-PDMS showed a main scattering peak at $q^*=0.62$ $nm^{-1}$. The second harmonic at $2q^*=1.2$ $nm^{-1}$ can barely be seen. In comparison, the SAXS spectrum of PMMA-methyl-triazolium iodide-PDMS showed a sharper main scattering peak at $q^*=0.57$ $nm^{-1}$ and strong harmonics at $2q^*=1.13$ and $3q^*=1.71$. The narrower main scattering peak, and the stronger harmonics, of the quaternized polymer indicated improved long-range ordering and a narrower interfacial width, respectively.

REFERENCES

Each of the following references is hereby incorporated by reference in its entirety.

(1) Henry, S. M., Convertine, A. J., Benoit, D. S. W., Hoffman, A. S. & Stayton, P. S. End-functionalized polymers and junction-functionalized diblock copolymers via RAFT chain extension with maleimido monomers. *Bioconjugate chemistry* 20, 1122-1128 (2009).

(2) Zhang, L., Lu, D., Tao, K. & Bai, R. Synthesis, Characterization and Self-Assembly of Novel Amphiphilic Block Copolymers with a Polyhedral Oligomeric Silsesquioxanes Moiety Attached at the Junction of the Two Blocks. *Macromolecular rapid communications* 30, 1015-1020 (2009).

(3) Kim, S. H. et al. A Supramolecularly Assisted Transformation of Block-Copolymer Micelles into Nanotubes. *Angewandte Chemie International Edition* 48, 4508-4512 (2009).

(4) Fournier, D., Hoogenboom, R. & Schubert, U. S. Clicking polymers: a straightforward approach to novel macromolecular architectures. *Chem. Soc. Rev.* 36, 1369-1380 (2007).

(5) Ermakova, T. et al, 1-Vinyl-4-alkyl-1,2,4-triazolium salts. *Chemistry of Heterocyclic Compounds* 20, 1167-1169 (1984).

(6) a) S. S. Khan, S. Hanelt and J. Liebscher, Arkivoc, 2009, (xii), 193.

b) Nulwala, H. B. et al. Probing the structure-property relationship of regioisomeric ionic liquids with click chemistry. *Green Chem.* 13, 3345-3349 (2011).

c) Dimitrov-Raytchev, P., Beghdadi, S., Serghei, A. & Drockenmuller, E. Main-chain 1,2,3-triazolium-based poly (ionic liquid) s issued from AB+AB click chemistry polyaddition. *Journal of Polymer Science Part A: Polymer Chemistry* (2012).

The embodiments illustrated and discussed in this specification are intended only to teach those skilled in the art the best way known to the inventors to make and use the invention. Nothing in this specification should be considered as limiting the scope of the present invention. All examples presented are representative and non-limiting. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

What is claimed is:

1. A block copolymer comprising a moiety of formula (I):

$$A\text{-}J\text{-}B \quad (I)$$

wherein
A is a first polymer block;
B is a second polymer block, wherein the A block and the B block are chemically dissimilar; and
J is a junction linking the A block to the B block and including one or more electrostatically charged moieties.

2. The block copolymer of claim 1, wherein the A block and the B block are each independently selected from a poly((meth)acrylate), a poly(styrene), a poly(alkylene oxide), and a poly(siloxane).

3. The block copolymer of claim 1, wherein J is an N-alkyl triazolium moiety.

4. The block copolymer of claim 1, wherein J is an oligomeric segment including from 1 to 10 electrostatically charged moieties.

5. The block copolymer of claim 1, wherein the A block includes a poly((meth)acrylate), a poly(styrene), a poly(alkylene oxide), a poly(2-vinylpyridine), or poly(lactide) and the B block includes a poly(siloxane).

6. The block copolymer of claim 5, wherein the A block is poly(methyl methacrylate) and the B block is poly(dimethylsiloxane).

7. The block copolymer of claim 1, comprising a counterion selected from the group consisting of $F^-$, $Cl^-$, $Br^-$, $I^-$, $BF_4^-$, $PF_6^-$, $Tf_2N^-$, $OTf^-$ and $SbF_6^-$.

8. The block copolymer of claim 1, further comprising a third block.

9. A composite structure for forming a patterned substrate, comprising:
a substrate; and
a layer including a block copolymer material formed on at least a portion of a surface of said substrate,
wherein said block copolymer material includes a moiety of formula (I):

$$A\text{-}J\text{-}B \quad (I)$$

wherein
A is a first polymer block;
B is a second polymer block, wherein the A block and the B block are chemically dissimilar; and
J is a junction linking the A block to the B block and including one or more electrostatically charged moieties;

wherein said substrate becomes said patterned substrate after processing said composite structure.

10. The composite structure of claim 9, wherein said substrate comprises a plurality of material layers.

11. The composite structure of claim 9, wherein the A block and the B block are each independently selected from a poly((meth)acrylate), a poly(styrene), a poly(alkylene oxide), and a poly(siloxane).

12. The composite structure of claim 9, wherein J is an N-alkyl triazolium moiety.

13. The composite structure of claim 9, wherein J is an oligomeric segment including from 1 to 10 electrostatically charged moieties.

14. The composite structure of claim 9, wherein the A block includes a poly((meth)acrylate), a poly(styrene), or a poly(alkylene oxide), and the B block includes a poly(siloxane).

15. The composite structure of claim 14, wherein the A block is poly(methyl methacrylate) and the B block is poly(dimethylsiloxane).

16. A method for forming a patterned substrate comprising the steps of:
(a) providing a substrate;
(b) forming a layer including a block copolymer material on at least a portion of a surface of said substrate, wherein said block copolymer material includes a moiety of formula (I):

$$A\text{-}J\text{-}B \quad (I)$$

wherein
A is a first polymer block;
B is a second polymer block, wherein the A block and the B block are chemically dissimilar; and
J is a junction linking the A block to the B block and including one or more electrostatically charged moieties;
(c) exposing the layer to an etching process, wherein the etching process exposes a pattern of regions of the substrate; and
(d) exposing the pattern of regions of substrate material to a second etching process selected for its ability to etch the layer of substrate exposed by step (c).

17. The method of claim 16, wherein the pattern has features between about 5 nm and about 100 nm in size.

18. The method of claim 16, further comprising annealing the mask material on the substrate.

* * * * *